(12) United States Patent
Robinson

(10) Patent No.: US 6,326,634 B1
(45) Date of Patent: Dec. 4, 2001

(54) E-BEAM SHAPE APERATURE INCORPORATING LITHOGRAPHICALLY DEFINED HEATER ELEMENT

(75) Inventor: Christopher F. Robinson, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/364,843

(22) Filed: Jul. 30, 1999

(51) Int. Cl.[7] ............................ G02B 5/00; G21K 1/00; H01J 1/52; H01J 3/00; H01J 5/18
(52) U.S. Cl. ........................ 250/505.1; 430/313
(58) Field of Search .................. 250/492.1, 492.2, 250/492.21, 492.3, 505.1; 430/313

Primary Examiner—Teresa M. Arroyo
Assistant Examiner—Sharon Payne
(74) Attorney, Agent, or Firm—McGuireWoods, LLP; Eric W. Petraske

(57) ABSTRACT

A resistive heater element is integrally formed with a beam shaping aperture foil by lithographic patterning of a doped semiconductor layer of which the aperture foil is formed over an insulator, resulting in a device of greatly increased structural robustness and reliability. Heat provided to the aperture foil by the heater element greatly reduces the accretion of deposits thereon which can distort the aperture shape and/or, deflect the beam when electrostatic charge accumulates thereon. The lithographic patterning process for fabricating the integral heater and aperture foil is only slightly increased in complexity from the current process for fabricating an aperture foil alone by an additional resist application and exposure, ohmic contact formation and use of an additional etchant and is of high yield.

15 Claims, 2 Drawing Sheets

E-BEAM SHAPE APERATURE INCORPORATING LITHOGRAPHICALLY DEFINED HEATER ELEMENT

BACKGROUND OF THE INVENTION

1. Field of the Invention

The present invention generally relates to charged particle beam systems employing a shaped beam of charged particles and, more particularly, to electron beam lithography tools having a beam-shaping aperture.

2. Description of the Prior Art

Many lithographic processes are well-known and highly developed, particularly for semiconductor integrated circuit manufacturing processes. Electromagnetic radiation has generally been the exposure medium of choice for exposing a resist which is later developed to form a pattern which will define the location and basic dimensions of devices which are included in the integrated circuit. However, the need for increased performance and functionality of integrated circuit chips and increased economy of manufacture has led to design rules and feature size regimes of 0.1 micron or smaller which cannot be produced even with very short wavelength radiation for which suitable resists are known. Accordingly, charged particle beams have been used for resist exposures to develop feature sizes in such regimes.

An electron beam is generally preferred to beams of other charged particles for exposure of a resist since the much lower mass of electrons relative to ions allows the beam to be readily controlled. It is a relatively common practice in production of extremely fine features to provide shaping of the beam with a shaped aperture or respective portions or sub-fields of a patterned mask to build up the desired exposure pattern through multiple exposures. Accurate shaping of the beam is extremely important since it controls the quality of the exposure spot.

Use of an electron beam is also preferred to ion beams since it also limits the deposition of material on the interior of the tool and structures which intercept portions of the beam, in particular. Nevertheless, some deposition of contaminants is unavoidable in electron beam systems and is particularly severe where the electron beam must impinge upon some structure, such as where a shaped aperture is provided in a plate in order to shape the electron beam. The contaminant materials are principally cracked hydrocarbons and silicon compounds produced by decomposition (due to the energy of the beam) of lubricants/sealants required for assembly and proper sealing of the vacuum chamber of the tool and outgassed from the exposed imaging resist.

By the same token, the position of the effective edges of the aperture or other structure is particularly critical to the production of feature sizes for which the electron beam tool is required and the effective position of the edges is affected by deposits thereon. Further, deposits of cracked hydrocarbons and silicon compounds exhibit low conductivity and may thus accumulate charge thereon which can serve to further distort or even deflect the beam; compromising beam shape and position of impingement on the target (e.g. resist on a wafer).

The throughput of the electron beam tool is also critical to manufacturing efficiency. Therefore, manufacturing efficiency is severely compromised by periods of service and reduced useful production time between periods of service or even recalibration. When deposits of contaminants compromise the accuracy (e.g. shape and/or location) of the lithographic pattern that can be produced, there is no alternative to removing the tool from useful service to renew or replace the parts on which deposits of contaminants have formed. Beam shaping aperture plates are expensive to produce and are very delicate, generally requiring replacement and increasing the cost of operating the electron beam tool.

In this regard, it is known that an elevated surface temperature of an element (equal to or greater than 200° C.) reduces the rate of deposition of contaminants on that element and can thus increase the intervals between required periods for servicing of the tool and reduce the number of new or renewed aperture plates required for a given number of exposures. To achieve such elevated temperatures, it has been the practice, in tools using Gaussian beams (e.g. having an electron density or flux distribution across the beam which is approximately Gaussian) to make the aperture plate self-heating since the aperture absorbs the energy in the "tails" of the Gaussian distribution of electron flux to improve beam current uniformity across the remaining beam.

Self-heating is generally accomplished by thermally isolating the aperture foil (used to conduct the intercepted beam current) from the thermal mass of the beam column (i.e. supporting apparatus for the aperture plate being formed of webs, stand-offs or the like, preferably of materials of low thermal conductivity). By limiting conduction of heat derived from absorbed electron energy away from the aperture foil, an elevated temperature can be achieved.

However, this solution is less than fully satisfactory since the heating may be irregular if the beam is not exactly centered on the aperture and uneven heating (and consequent uneven expansion of the aperture plate structure with increased temperature) tends to shift the aperture away from the region where the greatest beam current is incident, aggravating the uneven heating even if an approximately constant aperture foil temperature can be achieved. For shaped beam systems, self-heating is impractical since the absorbed electron current and energy is necessarily dependent on the amount and nature of the beam shaping which fluctuates over the course of pattern writing and prevents a constant aperture foil temperature from even being approximated.

Another attempt to provide elevated temperature of the aperture foil is to provide a separate heater mounted close to or in contact with the aperture foil. However, such an expedient complicates the structure of the e-beam tool. Further, such heaters are very delicate and can be easily damaged by routine handling during installation. Moreover, conventional manufacturing techniques for such separate heater elements employ a resistive paste on a ceramic substrate. Manufacture at the dimensions and with the material constraints imposed by the electron beam column have proven to be of low yield and the heater elements have proven to be inconsistently reliable. If such a heater element fails in such an arrangement during a production run, there is a trade-off between rate of deposition of contaminants resulting in acceleration of damage to the aperture, loss of throughput during replacement, and possible reduction of manufacturing yield as the aperture shape and dimensional stability of the beam column become largely unpredictable.

SUMMARY OF THE INVENTION

It is therefore an object of the present invention to provide a structurally robust one-piece heated aperture for use in a shaped beam charged particle beam tool.

It is another object of the invention to provide a metallic foil aperture for a charged particle beam tool in which a semiconductor substrate functions as both a handling frame and a heater element.

It is a further object of the invention to provide a heater element and method for fabricating the same principally by lithographic processes and semiconductor manufacturing processes.

In order to accomplish these and other objects of the invention, a shape aperture element for an electron beam tool is provided comprising a heater element formed from a layer of doped semiconductor and having contacts formed thereon, an aperture foil of conductive material, and an insulator layer interposed between the heater element and the aperture foil.

In accordance with another aspect of the invention, an integral aperture foil and heater element and method of making the same is provided by forming an insulating layer on a first side of a substrate of a resistive material, forming an aperture resist pedestal on the insulating layer, forming a layer of metal around the resist pedestal, and etching a pattern of trenches through the subtrate and the insulating layer.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
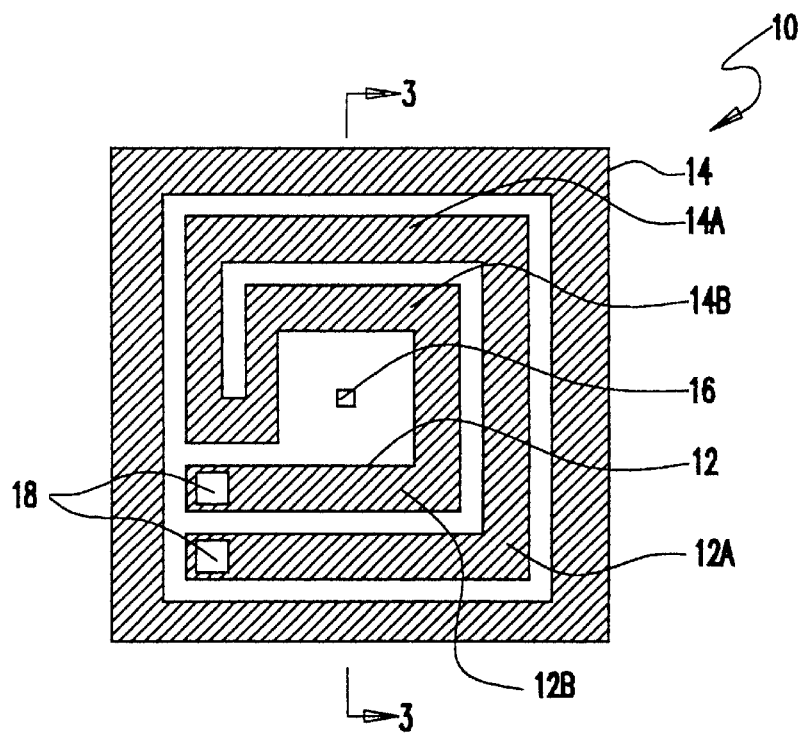
FIG. 1 is a plan view of the back or bottom side of the aperture plate and illustrates a preferred heater element pattern.

Referring now to the drawings, and more particularly to FIG. 1, there is shown, in plan view, a surface of an aperture plate 10 including a preferred pattern of a serpentine heater element 12. When the aperture plate 10 is installed in an electron beam lithographic tool, as is preferred, the surface shown will generally face away from the charged particle or electron source. Since electron beam lithographic tools are generally arranged with a vertical beam column with the source at the top, the surface shown in FIG. 1 will generally face downwardly and thus will sometimes be referred to hereinafter as the back or bottom surface of aperture plate 10. Similarly, the opposite side of the aperture plate 10 will sometimes be referred to hereinafter as the front or top surface.

Heater element 12 preferably substantially surrounds the aperture 16 at a distance therefrom corresponding to about ten times the transverse dimension of the aperture or beam and is preferably serpentine shaped to pass substantially twice around the aperture. The serpentine shape provides cancellation of the magnetic fields generated by the coiled heater elements. When considered from the beam axis, this element appears similar to two concentric coils with identical currents flowing in opposite directions. Thus the magnetic fields generated by the coils are of opposite polarity. This shape also provides for a more nearly uniform temperature in the vicinity of the aperture since the heater element 12 will preferably be of substantially constant resistance per unit length. Power dissipation along its length will thus be determined by the temperature difference between the heater element 12 and surrounding structure to which heat can be lost by conduction through the support structure. Since the heater is inside the vacuum chamber of an electron beam column, radiation losses are very small.

A frame 14 is provided along an outer perimeter of the aperture plate to yield increased structural robustness and rigidity and to resist damage during handling and installation in a charged particle beam tool. The configuration or width of frame 14 is not at all critical to the practice of the invention and will usually be configured to accommodate mounting in a particular electron beam tool with hardware suitable to the tool; the details of which are similarly unimportant to the practice of the invention.

Ohmic contacts 18 are provided at the ends of the serpentine heater element 12. The form and constitution of the ohmic contacts are unimportant to the practice of the invention and numerous structures which will withstand the temperatures at which the heater is designed to operate, will be evident to those skilled in the art. For example, aluminum can be deposited (e.g. by sputtering or evaporation), patterned to form connection pads and heated to a temperature slightly below the Al/Si eutectic temperature to drive a portion of the aluminum into the silicon and thus improve adhesion.

Figure 2:
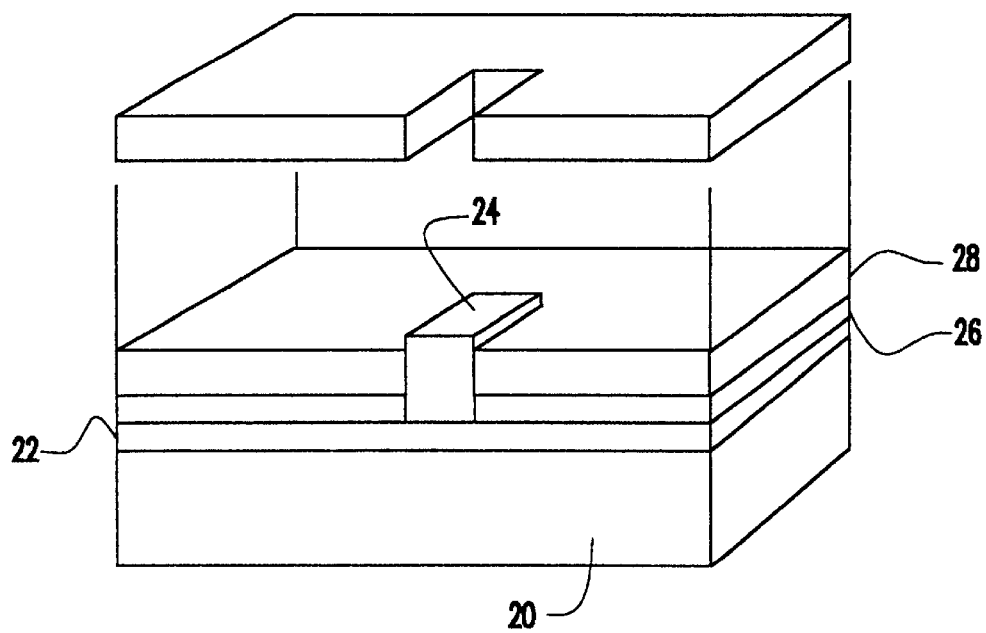
FIG. 2 is an isometric view of a section of an aperture plate without a heater element, illustrating fabrication thereof.
Figure 3:
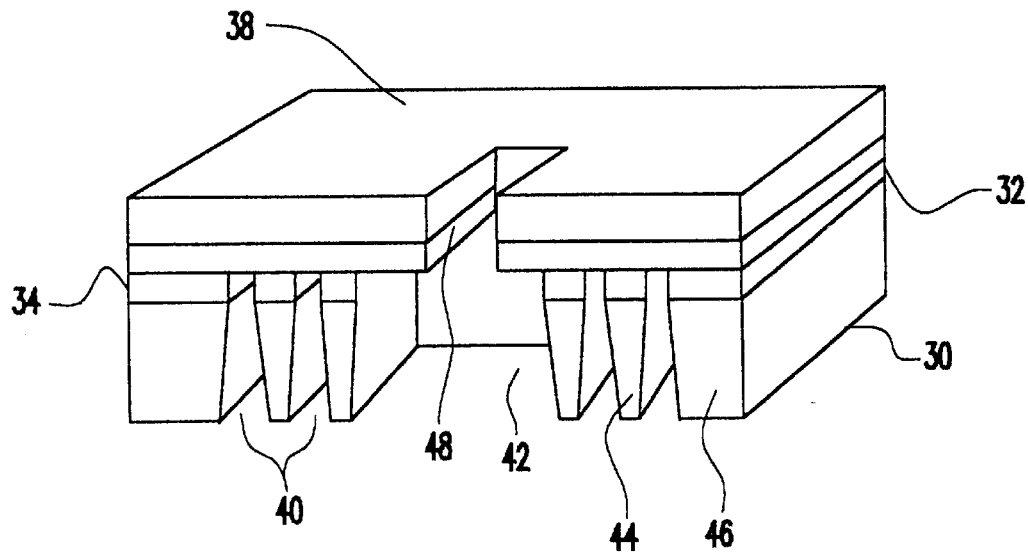
FIG. 3 is an isometric view of a section (3—3 of FIG. 1) of an aperture plate including an integral heater element in accordance with the invention, also illustrating fabrication thereof.

Referring now to FIGS. 2 and 3, a method of fabrication of the combination heater and aperture plate in accordance with the invention will now be discussed. It is important to an appreciation of the meritorious effects of the invention that the method of fabrication of the combination device, depicted in FIG. 3, requires only a very few simple and high-yield processes beyond those required for an aperture plate alone, depicted in FIG. 2. In this connection, it should be appreciated that while FIG. 2 illustrates a current fabrication process for an aperture plate alone and does not depict the invention, no portion of FIG. 2 is admitted to be prior art in regard to the present invention and FIG. 2 is labelled "Related Art" for that reason. Further, the physical details of the aperture plate depicted in FIG. 2 are entirely incidental to the illustration of the method and are illustrated as having a form similar to the illustration of FIG. 3 in the interest of facilitating comparison therewith.

The manufacture of an aperture plate currently begins with substrate 20 on which a thin metal plating base layer 22 is provided. A 0.02 micron thick layer of titanium-tungsten or chromium is exemplary of materials suitable and preferred for providing adhesion to substrate 20 which is preferably of silicon having a thickness of about 625 microns and 100 mm in transverse dimension (e.g. diameter). This adhesion layer is preferably followed by a deposit of 0.05 microns of gold for good conductivity during a later plating process. an electroplating process is preferred but other processes are suitable and provision of a thin layer of gold is preferred in any case.

Next, a resist (e.g. 25 microns of PMMA) layer is formed and lithographically patterned to form an aperture pedestal of arbitrary but often preferably rectangular shape. A sacrificial release layer 26, preferably about a 1 micron thickness of nickel, is plated up around the pedestal, followed by plating of the aperture foil material 28, preferably about 20 microns of gold. After stripping the remainder of the resist (forming the aperture pedestal), the aperture foil 28 is then floated off the underlying structure/substrate in an etch bath suitable for etching the release material of release layer 26. Thus, a relatively delicate foil is formed with an aperture which exactly corresponds to the perimeter of the aperture pedestal.

In contrast and referring to FIG. 3, the formation of the invention uses many of the same processes but results in a highly robust aperture structure combined with a structurally robust heater, as will now be discussed. As with the aperture plate of FIG. 2, the process preferably begins with a thick silicon substrate on which an insulating layer 32, preferably a 2 micron thickness of silicon dioxide, is grown or deposited. However, a desired specific resistance, $r_{sp}$, of the silicon wafer should be obtained by suitable impurity concentration therein. An aperture resist pedestal is then formed on top of the insulating layer 32. A metal plating base 34, preferably of the same materials as layer 22 of FIG. 2, is then deposited on insulating layer 32 around the resist pedestal. There is no need for a release layer. The aperture foil is plated up in the same manner illustrated in FIG. 2 (and therefore omitted from FIG. 3 in the interest of clarity).

After the resist is stripped away, a temporary protective layer of silicon dioxide (e.g. about 2 microns in thickness is adequate) is deposited on the gold foil. Ohmic contacts (e.g. of aluminum) are then formed at locations which will correspond to the ends of the heater element. A resist is then applied to the back or bottom side of substrate 30 and patterned by any convenient lithographic process to define the desired shape of the heater element 44 and frame 46.

Figure 4:
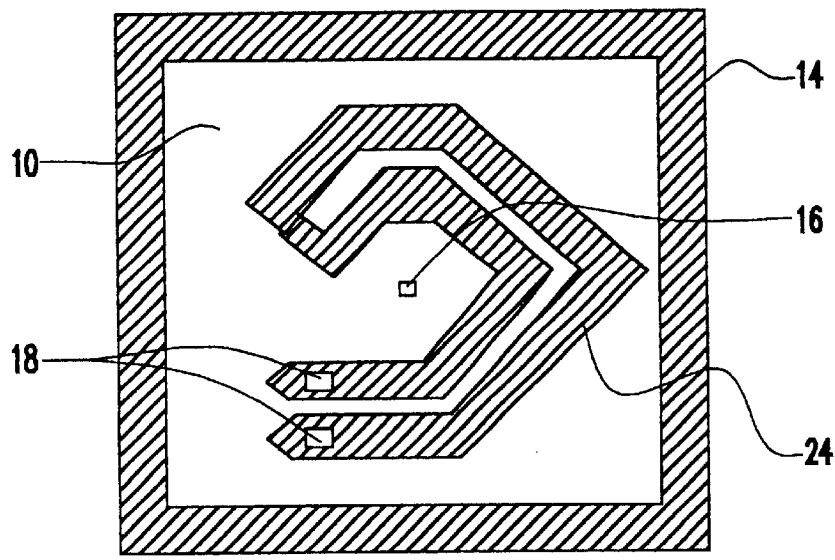
FIG. 4 is a plan view of the back or bottom side of the aperture plate illustrating an alternative form of an integral heater element in accordance with the invention.

The resist pattern is then transferred into the silicon substrate by an appropriate etching process (e.g. to form trenches 40 and a central cavity 42 around the aperture 48. A KOH etch solution produces the trapezoidal cross-section shown in (100) silicon or this same anisotropic etch with a (110) silicon substrate produces a rectangular cross section, but requires a more hexagonal heater element design such as that depicted in FIG. 4). A central cavity 42 around the aperture 48 and a final etch (e.g. using hydrofluoric acid) removes the insulating layer between portions of the heater element and the frame and around the aperture as well as the protective coating on the front or top side of the aperture foil.

In regard to the patterning of the heater element, it is generally preferred to design the lithographic pattern such that the spacing (e.g. width of trenches 40) between respective portions of the heater element and between the heater element and the frame be limited to a dimension comparable to the thickness of the insulator layer 32 and somewhat less than the thickness of the aperture foil 38. That is, maximization of area of the heater element adjacent the aperture foil minimizes thermal resistance across the insulator and, additionally, maximizes structural integrity and robustness of the entire device since, as can be appreciated from FIGS. 1 and 3, the respective portions of the heater element and the frame are laterally supported by each other only through the thin aperture foil. While the aperture foil is thin and preferably of a highly conductive metal such as gold that may be very soft and/or malleable, maintaining the trench width small and only sufficient to prevent breakdown adjacent the aperture foil, together with the serpentine layout of the gap, provides substantial stiffness.

Thus, in summary and in comparison with the process of FIG. 2, the fabrication of the invention requires formation of an additional insulator layer while avoiding a need for release layer 26, additional resist patterning on the back or bottom side of the wafer, etching with two different etchants (preferably wet etches by immersion in respective etchants which is easily performed) and the formation of heater contacts. The net increase in process complexity relative to fabrication of an aperture foil can be considered as limited to an additional resist application and lithographic exposure, contact formation and use of a second etchant.

It should be appreciated that the dimensions of frame 46 can be chosen at will to provide suitable robustness of the combination device. Likewise, the dimensions of the heater element in length and cross-section in combination with the specific conductivity of the remaining portion of the silicon substrate can be determined and the heater element formed to obtain desired electrical characteristic and heat generation. Specifically, to obtain desired temperatures with a convenient power supply (and suitably thermally insulative mounting) it is desirable and preferred to fix the resistance of the heater element at about 200 ohms. This resistance value can be easily established for devices of realistic dimensions using the well-known formula:

$$R = r_{sp} * l/(w*t) = 200 \text{ ohms},$$

using, for example, $r_{sp}$=0.40 ohm cm corresponding to an impurity concentration of $10^{17}/cm^3$ of boron (which is readily obtainable commercially), l=3.1 cm, w (the effective (e.g. average for a trapezoidal cross-section) width of the heater element)=0.10 cm and t (the thickness of the substrate)=0.0625 cm.

In view of the foregoing, it is apparent that the combination heater and aperture foil structure in accordance with the invention provides a robust structure which is much less subject to damage than either aperture foils or separate heater elements. The combined, integrally formed structure can be fabricated by a process having only slightly increased complexity over that required to form the aperture foil alone. The resulting combination heater/aperture is of high reliability, has an consistent and extended mean time to failure and can be manufactured at very high yield. Use of the combination structure in electron beam lithography processes results in high throughput and low machine downtime as well as supporting improved fidelity of exposure patterns by reducing deposits on the aperture plate which can distort beam shape and/or cause deflection of the beam from an intended exposure location.

While the invention has been described in terms of a single preferred embodiment, those skilled in the art will recognize that the invention can be practiced with modification within the spirit and scope of the appended claims. For example, the heater element could be structurally integrated with the frame and other shapes for the heater element in addition to those shown in FIGS. 1 and 4 could be used which contain more or less folds to substantially surround the aperture a smaller or greater number of times. Further, a generally spiral configuration of the heater element, whether or not folded, may be used to provide a greater distance between ohmic contacts.

Having thus described my invention, what I claim as new and desire to secure by Letters Patent is as follows:

1. A shape aperture element for an electron beam tool comprising heater element formed from a layer of doped semiconductor and having contacts formed thereon, an aperture foil of conductive material, and an insulator layer interposed between said heater element and said aperture foil.

2. A shape aperture as recited in claim 1, further comprising a frame formed from said layer of doped semiconductor.

3. A shape aperture as recited in claim 1, wherein said heater element is serpentine in shape and substantially surrounds an aperture in said aperture foil.

4. A shape aperture as recited in claim 2, wherein said heater element is serpentine in shape and substantially surrounds an aperture in said aperture foil.

5. A shape aperture as recited in claim 1, wherein said heater element is trapezoidal in cross-section.

6. A shape aperture as recited in claim 2, wherein said heater element is trapezoidal in cross-section.

7. A shape aperture as recited in claim 4, wherein said heater element is trapezoidal in cross-section.

8. A shape aperture for a charged particle beam tool having a resistive heater element integrally formed with but insulated from an aperture foil having a beam shaping aperture therein.

9. A shape aperture as recited in claim 8, wherein said resistive heater element has a resistance of approximately two hundred ohms.

10. A shape aperture as recited in claim 8, further comprising a frame, integrally formed with said aperture foil and substantially surrounding said heater element.

11. An integrally formed aperture foil and heater element for a charged particle beam tool formed by a method comprising steps of forming an insulating layer on a first side of a substrate of a material having a specific resistance, forming an aperture resist pedestal on said insulating layer, forming a layer of metal on said insulating layer around said resist pedestal, forming ohmic contacts on a second side of said substrate, and etching a pattern of trenches through said subtrate material and said insulating layer.

12. An integrally formed aperture foil and heater element as recited in claim 11, wherein said etching step is performed with a KOH solution and a hydrofluoric acid solution, in sequence.

13. An integrally formed aperture foil and heater element as recited in claim 11, including the further step of applying a resist layer to said second side of said substrate and lithographically patterning said resist layer.

14. An integrally formed aperture foil and heater element as recited in claim 11, wherein said specific resistance is approximately 0.40 ohm cm.

15. An integrally formed aperture foil and heater element as recited in claim 14, wherein said substrate is silicon having a concentration of approximately $10^{17}/cm^3$ of boron therein.

* * * * *